(12) United States Patent
Tanaka et al.

(10) Patent No.: US 9,496,344 B2
(45) Date of Patent: Nov. 15, 2016

(54) SEMICONDUCTOR DEVICE INCLUDING WELL REGIONS WITH DIFFERENT IMPURITY DENSITIES

(71) Applicants: Rina Tanaka, Chiyoda-ku (JP); Akihiko Furukawa, Chiyoda-ku (JP); (Continued)

(72) Inventors: Rina Tanaka, Chiyoda-ku (JP); Akihiko Furukawa, Chiyoda-ku (JP); (Continued)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/387,727

(22) PCT Filed: Feb. 26, 2013

(86) PCT No.: PCT/JP2013/001084
§ 371 (c)(1),
(2) Date: Sep. 24, 2014

(87) PCT Pub. No.: WO2013/145545
PCT Pub. Date: Oct. 3, 2013

(65) Prior Publication Data
US 2015/0048384 A1  Feb. 19, 2015

(30) Foreign Application Priority Data

Mar. 30, 2012 (JP) ................................. 2012-081097

(51) Int. Cl.
*H01L 29/16* (2006.01)
*H01L 29/47* (2006.01)
(Continued)

(52) U.S. Cl.
CPC ....... *H01L 29/1608* (2013.01); *H01L 29/0619* (2013.01); *H01L 29/47* (2013.01);
(Continued)

(58) Field of Classification Search
CPC ............... H01L 29/1608; H01L 29/872; H01L 29/0619; H01L 2924/12032; H01L
(Continued)

(56) References Cited

U.S. PATENT DOCUMENTS

2002/0105007 A1\* 8/2002 Saggio et al. ................ 257/109
2002/0125482 A1\* 9/2002 Friedrichs et al. ............ 257/73
(Continued)

FOREIGN PATENT DOCUMENTS

CN    102208456 A    10/2011
JP    5-90565        4/1993
(Continued)

OTHER PUBLICATIONS

International Search Report issued May 14, 2013, in PCT/JP2013/001084, filed Feb. 26, 2013.
(Continued)

*Primary Examiner* — Tucker J Wright
(74) *Attorney, Agent, or Firm* — Oblon, McClelland, Maier & Neustadt, L.L.P.

(57) ABSTRACT

In a JBS diode using a wide band gap semiconductor, the wide band gap semiconductor has a large built-in voltage, which sometimes causes difficulties for the pn diode portion to turn on, resulting in a problem that resistance to surge currents is not sufficiently ensured. In order to solve this problem, in the wide-band-gap JBS diode, a pn junction of the pn diode is formed away from the Schottky electrode, and well regions are formed so as to have a width narrowed at a portion away from the Schottky electrode.

9 Claims, 12 Drawing Sheets

(71) Applicants: Masayuki Imaizumi, Chiyoda-ku (JP);
Yuji Abe, Chiyoda-ku (JP)

(72) Inventors: Masayuki Imaizumi, Chiyoda-ku (JP);
Yuji Abe, Chiyoda-ku (JP)

(51) Int. Cl.
*H01L 29/872* (2006.01)
*H01L 29/66* (2006.01)
*H01L 29/06* (2006.01)
*H01L 29/36* (2006.01)

(52) U.S. Cl.
CPC ......... *H01L 29/6606* (2013.01); *H01L 29/872*
(2013.01); *H01L 29/36* (2013.01)

(58) Field of Classification Search
CPC ..................... 29/0615;H01L 29/47; H01L
29/66143; H01L 21/0495; H01L
21/02529; H01L 29/66212
See application file for complete search history.

(56) References Cited

U.S. PATENT DOCUMENTS

| | | | |
|---|---|---|---|
| 2005/0139947 A1* | 6/2005 | Okada et al. | 257/480 |
| 2005/0167742 A1* | 8/2005 | Challa et al. | 257/328 |
| 2006/0022292 A1* | 2/2006 | Shenoy | 257/472 |
| 2006/0237813 A1* | 10/2006 | Hshieh et al. | 257/475 |
| 2006/0255423 A1* | 11/2006 | Ryu et al. | 257/485 |
| 2008/0169475 A1* | 7/2008 | Nishio et al. | 257/77 |
| 2008/0277669 A1* | 11/2008 | Okuno et al. | 257/77 |
| 2008/0296587 A1* | 12/2008 | Yamamoto et al. | 257/77 |
| 2009/0008651 A1* | 1/2009 | Okuno et al. | 257/77 |
| 2009/0218621 A1* | 9/2009 | Pfirsch et al. | 257/342 |
| 2010/0032730 A1* | 2/2010 | Endo et al. | 257/280 |
| 2011/0175106 A1* | 7/2011 | Mizukami et al. | 257/77 |
| 2012/0205770 A1* | 8/2012 | Tung et al. | 257/471 |
| 2012/0228636 A1* | 9/2012 | Maeyama et al. | 257/77 |
| 2012/0241897 A1* | 9/2012 | Qu et al. | 257/475 |

FOREIGN PATENT DOCUMENTS

| | | |
|---|---|---|
| JP | 7-66433 | 3/1995 |
| JP | 7-226521 | 8/1995 |
| JP | 10-321879 | 12/1998 |
| JP | 2002-314099 | 10/2002 |
| JP | 2006-93382 | 4/2006 |
| JP | 2007-42997 | 2/2007 |
| JP | 2007-311822 | 11/2007 |
| JP | 2008-282973 | 11/2008 |
| JP | 2009-218236 | 9/2009 |

OTHER PUBLICATIONS

Combined Chinese Office Action and Search Report issued May 24, 2016 in Patent Application No. 201380017760.7 (with English language translation).

* cited by examiner

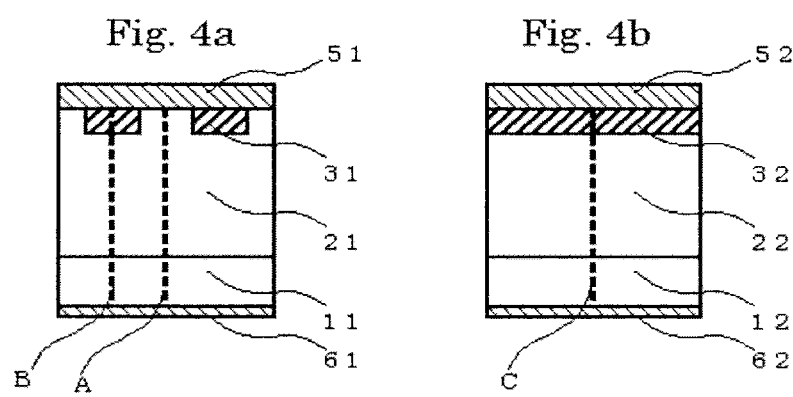

SEMICONDUCTOR DEVICE INCLUDING WELL REGIONS WITH DIFFERENT IMPURITY DENSITIES

TECHNICAL FIELD

The present invention relates to an element structure of a semiconductor device being a power semiconductor device and to a manufacturing method thereof.

BACKGROUND ART

As for a kind of power semiconductor devices, a JBS (Junction Barrier Schottky) diode having a Schottky diode and a pn diode in parallel or an MPS (Merged-PiN Schottky) diode is known (referred to as a JBS diode, below).

As for a JBS diode using a silicon semiconductor, a semiconductor device has been known whose p-type region includes a low impurity density portion (P−) and a high impurity density portion (P+) covering a top portion thereof (for example, Patent Document 1). Patent Document 1 describes that a JBS diode having less minority carrier accumulation in a pn diode portion and a short reverse recovery time can be obtained.

Furthermore, as for a JBS diode using a silicon carbide semiconductor, a configuration has been known in which an insulation region is provided between a Schottky diode portion and a pn diode portion (for example, Patent Document 2). Patent Document 2 describes that in a JBS diode using a silicon carbide semiconductor in which an insulation region is not provided, a pn diode does not conduct electricity in the on-state.

PRIOR ART DOCUMENT

Patent Document

Patent Document 1: Japanese Patent Laid-Open Publication No. H07-226521 (page 2-page 3, FIG. 3)
Patent Document 2: Japanese Patent Laid-Open Publication No. 2009-218236 (page 3-page 6, FIG. 1)

SUMMARY OF THE INVENTION

Problem to be Solved by the Invention

In a silicon semiconductor JBS as described in Patent Document 1, a silicon Schottky diode having a high switching responsiveness is combined parallel with a silicon pn diode to realize highly responsive switching and highly reliable switching because of reduction of the electric field near the Schottky electrode. This causes a steady-state forward current to mainly flow in the pn diode.

In contrast, in a case where the structure of Patent Document 1 is applied to a wide band gap semiconductor such as a silicon carbide semiconductor, a built-in potential of the pn diode is increased to about 3 V. This causes, as described in Patent Document 2, the steady state forward current to flow mainly in the Schottky diode.

On the other hand, in a silicon carbide JBS as described in Cited Document 2, an insulation region provided between a Schottky diode and a pn diode prevents an on-current of the Schottky diode from spreading to an n-type region that is a lower part of the pn diode, thereby preventing a forward current from exceeding that corresponding to the Schottky diode area.

Moreover, in the silicon carbide JBS, it is not easy for the pn diode to turn on; therefore, when a surge current or the like is generated, the surge current flows only in the Schottky diode so that an overcurrent flows in the Schottky diode, sometimes leading to a breakdown of the semiconductor device.

The present invention is made to solve the problems described above, and aims to obtain a semiconductor device, i.e. a JBS diode using a wide band gap semiconductor such as silicon carbide, which has a large on-current and whose pn diode easily turns on to have a large resistance to a surge.

Means for Solving Problem

A semiconductor device of the present invention includes: a wide band gap semiconductor substrate that is of a first conductive type; a drift layer that is of the first conductive type and configured with a wide band gap semiconductor and that is formed on a first main surface of the wide band gap semiconductor substrate; a plurality of first well regions that are of a second conductive type and that are formed in a surface layer portion of the drift layer adjacent to each other at a predetermined interval; a second well region that is formed adjacent to each of the first well regions and toward the semiconductor substrate, has a second conductive type impurity density lower than the first well regions, and has a width narrower than the first well regions; a Schottky electrode that is formed on surfaces of the drift layer and the first well regions to form a Schottky connection with the drift layer; and an ohmic electrode that is formed on a second main surface of the semiconductor substrate which is opposite to the first main surface, wherein when the semiconductor device is in an off-state, a surface layer portion of the drift layer that is between the first well regions and is in contact with the Schottky electrode is entirely depleted by a depletion layer expanding from the first well regions adjacent to each other, and there remain regions that are not depleted in the first well regions.

Effect of the Invention

In a semiconductor device of the present invention, a pn junction of a pn diode in a wide-band-gap JBS diode is formed at a portion away from a Schottky electrode and a p-type region is formed to have a narrow width at a portion away from the Schottky electrode; therefore, a lower bias voltage can flow a current in the pn diode, and a current flowing in the Schottky diode can be increased. Therefore, a semiconductor device having a high switching speed and a large resistance to surges can be obtained, in which even in a case where a surge current is generated, the surge current can easily flow in the pn diode, preventing an overcurrent from flowing in the Schottky diode.

BRIEF DESCRIPTION OF THE DRAWINGS

FIG. 4 are schematic views for explaining an operation of the semiconductor device in Embodiment 1 of the present invention;

MODES FOR CARRYING OUT THE INVENTION

Embodiment 1

First, explanation will be made about the configuration of a semiconductor device in Embodiment 1 of the present invention. Here, a first conductive type is defined as n-type, and a second conductive type is defined as p-type.

Figure 1:
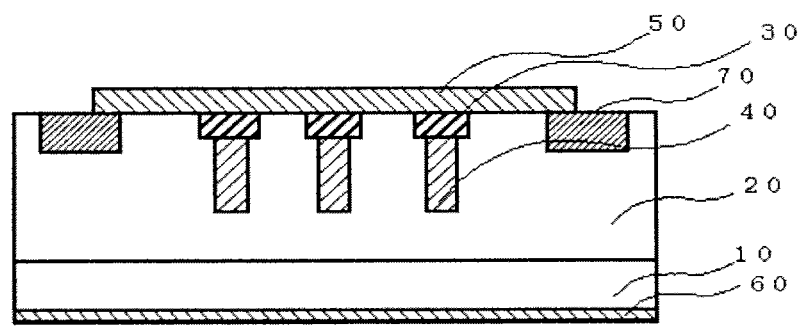
FIG. 1 is a schematic cross-sectional view that schematically represents a silicon carbide semiconductor device in Embodiment 1 of the present invention.

FIG. 1 is a schematic cross-sectional view of a silicon carbide JBS diode, i.e. a semiconductor device of this embodiment. In FIG. 1, on a first main surface of a semiconductor substrate 10 of a low-resistive n-type 4H silicon carbide material, a drift layer 20 of an n-type 4H silicon carbide material is formed. In a surface layer portion of the drift layer 20, a plurality of first well regions 30 of p-type are formed with a predetermined width and adjacent to each other at a predetermined interval. Under the first well regions 30 (toward the semiconductor substrate 10), second well regions 40 are formed so as to have a p-type impurity density lower than that of the first well regions 30 and have a width smaller than that of the first well regions 30. Between the second well regions 40 and the semiconductor substrate 10, the n-type drift layer 20 is formed. On surfaces of the first well regions 30 and the drift layer 20, a Schottky electrode 50 is formed. On a second main surface of the semiconductor substrate 10 which is opposite to the first main surface, an ohmic electrode 60 is formed so as to be in contact with the semiconductor substrate 10. In a surface layer portion of the drift layer 20 corresponding to a circumference of the Schottky electrode 50, a termination structure 70 of p-type is formed.

Figure 2:
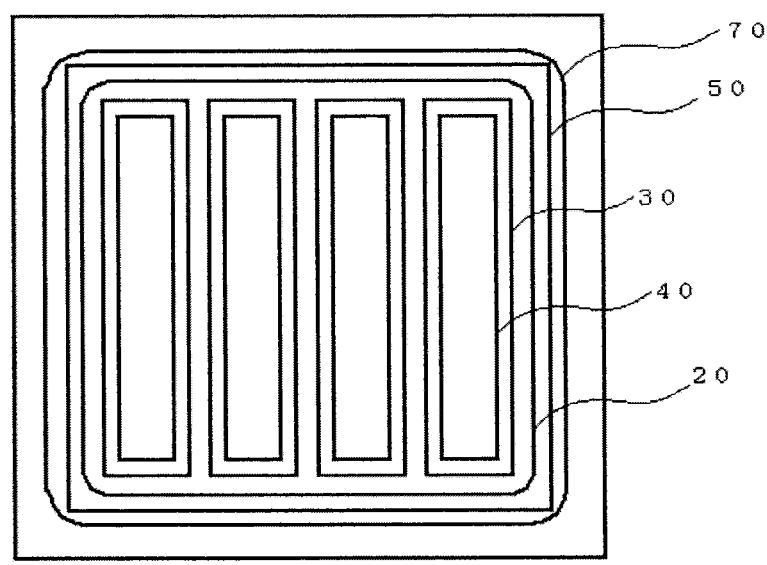
FIG. 2 is a plan view that schematically represents the semiconductor device in Embodiment 1 of the present invention.

FIG. 2 is a plan view perspectively seen from the top face of the silicon carbide JBS diode shown in FIG. 1, which is the semiconductor device of this embodiment. In FIG. 2, the Schottky electrode 50 is formed on a surface of the drift layer 20. In the surface layer portion of the drift layer 20 around the Schottky electrode 50, the termination structure 70 is formed. In the surface layer portion of the drift layer 20 under the Schottky electrode 50, the plurality of first well regions 30 having a rectangular shape in a top view are formed, with the predetermined width and at the predetermined interval. Under each of the first well regions 30 (toward the semiconductor substrate 10), the second well region 40 is formed so that its center coincides with that of the first well region 30 and its width is smaller than that of the first well region 30.

In the silicon carbide JBS diode shown in FIG. 1 and FIG. 2, the semiconductor substrate 10 is a 4H-type silicon carbide semiconductor substrate which is a low-resistive n-type and a 4H-polytype, and in which a face orientation of the first main surface is (0001) face and is off by 8 degrees or below with respect to the c-axis direction. The drift layer 20 of the n-type silicon carbide semiconductor contains nitrogen, as an n-type impurity, at a density between $1 \times 10^{13}$ $cm^{-3}$ and $1 \times 10^{16}$ $cm^{-3}$, and has a thickness approximately between 10 μm and 100 μm. The n-type impurity of the semiconductor substrate 10 and the drift layer 20 is nitrogen.

The first well region 30 of p-type contains Al, as a p-type impurity, at a density between $1 \times 10^{17}$ $cm^{-3}$ and $1 \times 10^{18}$ $cm^{-3}$, and has a depth between 0.1 μm and 0.5 μm. The second well region 40 of p-type contains Al as a p-type impurity, and has a width narrower than the first well region 30 and has a depth of 0.5 to 6 μm. The p-type impurity density of the second well region 40 is smaller than that of the first well region 30, for example one to two orders of magnitude smaller. The termination structure 70 is a mainly p-type region and the cross-section shape thereof may be suitably selected among a rectangular shape, an FLR (Field Limiting Ring) having discrete cross-sections, and the like; the densities of parts of the termination structure are also suitably determined. The material of the Schottky electrode 50 is Ti, and the material of the ohmic electrode 60 is Ni.

Next, explanation will be made, using a schematic cross-sectional view of FIG. 3, about a manufacturing method of a JBS diode using a silicon carbide semiconductor, i.e. the semiconductor device of this embodiment. FIG. 3 are schematic cross-sectional views for explaining the method of manufacturing the JBS diode using a silicon carbide semiconductor, i.e. the semiconductor device of this embodiment.

Figure 3A:
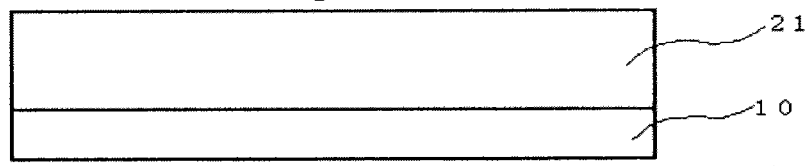
FIG. 3 are schematic cross-sectional views that schematically represent a manufacturing method of the semiconductor device in Embodiment 1 of the present invention.

First, as shown in FIG. 3a, on a semiconductor substrate 10 which contains, as an n-type impurity, nitrogen at a density of $1 \times 10^{18}$ cm$^{-3}$ or more and is of low-resistive n-type silicon carbide, a first drift layer region 21 is formed by epitaxial growth using CVD (Chemical Vapor Deposition) method, so as to be configured with silicon carbide, contain n-type impurities at a density between $1 \times 10^{13}$ cm$^{-3}$ and $1 \times 10^{16}$ cm$^{-3}$ and have a thickness between 1 pin and 5 μm.

Figure 3B:
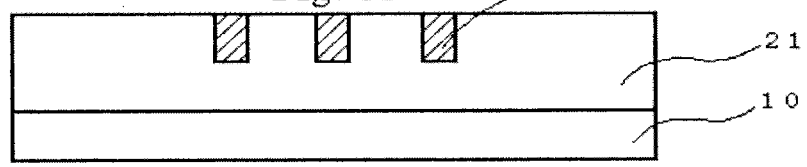

Next, as shown in FIG. 3b, first regions 41 of second well regions are formed at predetermined positions in the first drift layer region 21 by implanting ions of Al as a second conductive type impurity.

Figure 3C:
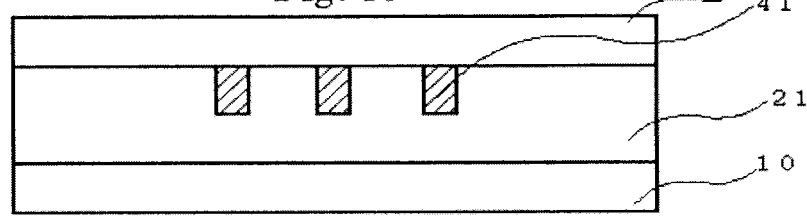

Next, as shown in FIG. 3c, on the first drift layer region 21 in which the first regions 41 of the second well regions are formed, a second drift layer region 22 is formed by epitaxial growth so as to have the same kind and same density of impurity as those of the first drift layer region 21 and have a thickness approximately between 0.5 μm and 2 μm.

Figure 3D:
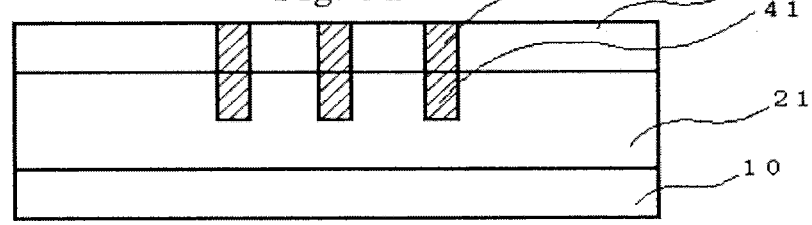

Next, as shown in FIG. 3d, by implanting ions of Al as the second conductive type impurity at plane positions corresponding to those of the first regions 41 of the second well regions, second regions 42 of the second well regions are formed so as to connect to the first regions 41 of the first well regions.

By repeating the steps shown in FIG. 3c and FIG. 3d, the drift layer 20 having a predetermined thickness and the second well regions 40 having a predetermined depth are formed.

Figure 3E:
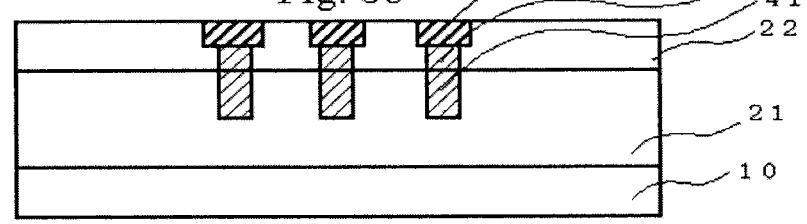

Next, as shown in FIG. 3e, at predetermined positions on a device in which the second well regions 40 are formed, first well regions 30 are formed by implanting ions of Al as the second conductive type impurity.

Next, a termination structure 70 is formed by implanting ions of Al as the second conductive type impurity, and activation annealing is performed to the ion-implanted impurities. The activation annealing is performed in conditions of a temperature range between 1500 degrees C. and 2200 degrees C., a time range between 0.5 minutes and 60 minutes and the like.

Next, a Schottky electrode 50 is formed on the surfaces of the drift layer 20 and the like by sputtering, and then an ohmic electrode 60 is formed on a rear side surface (a second main surface) of the semiconductor substrate 10 by sputtering, whereby the silicon carbide JBS diode, i.e. the semiconductor device of this embodiment, having a cross-section as shown in FIG. 1 can be produced.

Next, explanation will be made about operations of the silicon carbide JBS diode, i.e. the semiconductor device of this embodiment.

In the silicon carbide JBS diode, i.e. the semiconductor device of this embodiment, a current flows from the Schottky electrode 50 to the ohmic electrode 60 in the on-state; in the off-state, the potential of the ohmic electrode 60 becomes higher than the potential of the Schottky electrode 50, so that a reverse bias voltage is applied to pn junction portions between the n-type drift layer 20 and, the p-type first well regions 30 or second well regions 40, which thereby produces respective depletion layers expanding from the pn junction portions toward the n-type regions and the p-type regions.

When the rated reverse bias voltage is applied for the silicon carbide JBS diode of this embodiment, in the off-state, a surface layer portion of the drift layer 20 that is between the first well regions adjacent to each other and in contact with the Schottky electrode 50 is entirely depleted by depletion layers expanding from the first well regions 30, and the second well regions are depleted from both sides in horizontal directions of the cross-section so that the whole of the second well regions 40 are completely depleted.

The first well regions 30 include second conductive type impurities having a density higher than the second well regions 40 and have a width wider than the second well regions 40; therefore, the first well regions are not completely depleted in the off-state, i.e. there remain regions which are not depleted.

On the other hand, when the JBS diode with the pn diode and the Schottky diode parallelly connected is on, the current mainly flows in the Schottky diode portion.

Here, explanation will be made, using FIGS. 4 to 7, about the current flow and the potential distribution when the silicon carbide JBS diode of this embodiment is on.

FIG. 4 are schematic cross-sectional views that represent sectional structures of a typical silicon carbide JBS diode and a silicon carbide pn diode; FIG. 4a is a cross-sectional view of the silicon carbide JBS diode, and FIG. 4b shows a cross-sectional view of the silicon carbide pn diode.

In FIG. 4, the silicon carbide JBS diode corresponds to a silicon carbide JBS diode of this embodiment whose second well regions 40 are eliminated, i.e. the second well regions 40 remain the drift layer 20, and the silicon carbide pn diode corresponds to a silicon carbide JBS diode in FIG. 4 whose first well region 30 is formed on the whole surface. In the silicon carbide JBS diode and the silicon carbide pn diode of FIG. 4, n-type drift layers 21 and 22 are formed on semiconductor substrates 11 and 12. In surface layer portions of the drift layers 21 and 22, p-type first well regions 31 and 32 are formed. On the surfaces of the first well regions 31 and 32 and the drift layer 21, Schottky electrodes 51 and 52 are formed. On second main surfaces which are opposite sides of the first main surfaces of the semiconductor substrates 11 and 12, ohmic electrodes 61 and 62 are formed so as to be in contact with the semiconductor substrates 11 and 12. In the silicon carbide JBS diode of FIG. 4, the plurality of p-type first well regions 31 are separately formed; in the silicon carbide pn diode of FIG. 4, the p-type first well region 32 is formed on the whole surface layer portion of the drift layer 22.

Here, consideration will be made, as shown in FIG. 4, about a current path A and a current path B along which currents flow through the Schottky diode portion and a pn diode portion, respectively, when the silicon carbide JBS diode is on, and a current path C along which a current flows when the pn diode is on.

Figure 5:
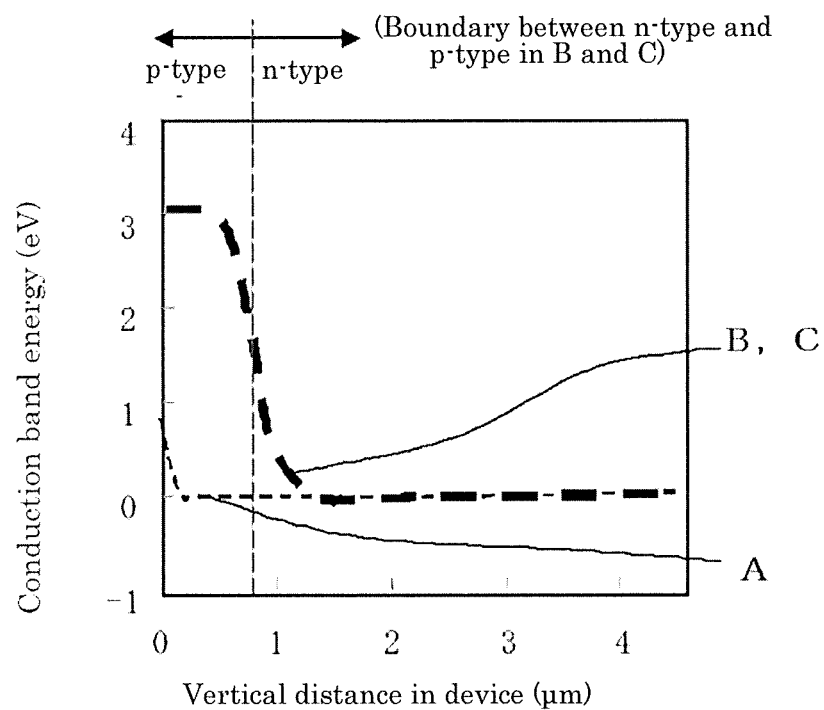
FIG. 5 is a potential distribution graph for explaining the operation of the semiconductor device in Embodiment 1 of the present invention.

FIG. 5 is a graph showing numerical calculation results of potential distributions along the current paths A, B, and C of FIG. 4, each of which indicates potential distribution with respect to the depth direction in a case where a bias voltage of zero volts is applied between an anode electrode (the Schottky electrodes 51 and 52) and a cathode electrode (the ohmic electrodes 61 and 62). Here, the thickness of the drift layers 21 and 22 is 4 μm; the horizontal width of the first well region 31 is 2 μm in the cross-section; and the gap length between the first well regions 31 is 2 μm (a repetition pitch of 4 μm). The thickness of the first well regions 31 and 32 is 0.8 μm. Comparison between the potential distributions along the current paths A, B, and C in FIG. 5 shows that the potential distributions along the current paths B and C including the pn junction are almost similar and are different from that of the current path A having no pn junction. In the 4H-type silicon carbide semiconductor, the pn junction has a high built-in voltage around 3 V, and the Schottky barrier between the Schottky electrode 51 and the drift layer 21 is large; therefore, the current does not flow at a bias of zero volts.

Figure 6:
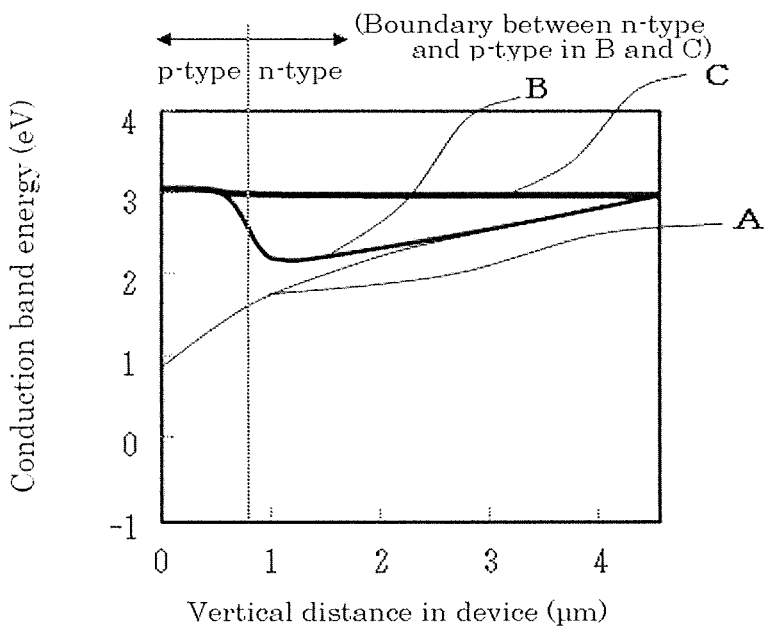
FIG. 6 is a potential distribution graph for explaining the operation of the semiconductor device in Embodiment 1 of the present invention.

FIG. 6 is a graph showing numerical calculation results of potential distributions along the current paths A. B, and C of FIG. 4, each of which indicates potential distribution with respect to the depth direction in a case where a bias voltage of 3 V is applied between the anode electrode (the Schottky electrodes 51 and 52) and the cathode electrode (the ohmic electrodes 61 and 62). The thickness of the drift layers 21 and 22, the width of the first well region 31 and the like are the same as those in FIG. 5. Comparison between the potential distributions along the current paths A, B, and C in FIG. 6 shows that there also appears a difference between the current paths B and C having the pn junction. In FIG. 6, in a Schottky diode portion on the current path A in the silicon carbide JBS diode, application of a bias in the forward direction eliminates an energy barrier, to produce a current flow. Also, in a silicon carbide pn diode element on the current path C, an energy barrier difference is almost eliminated, to produce a current flow. However, in a pn diode portion on the current path B in the silicon carbide JBS diode, the potential of the portion's n-type region is influenced by a current flowing through the current path A in the neighboring Schottky diode portion of the silicon carbide JBS diode, so that the potential difference between the p-type region and the n-type region is not reduced as much as the current path C. Therefore, application of a bias voltage of about 3 V does not cause the pn junction to turn on, resulting in no current to flow. To turn on the pn junction, it is necessary to apply a higher bias voltage.

On the other hand, according to the silicon carbide JBS diode being the semiconductor device of this embodiment, the second well region 40 is, as shown in the cross-sectional view of FIG. 1, formed under the first well region 30, so that a pn junction portion (a bottom end of the second well region 40) is formed at a position away from a Schottky interface (an interface between the Schottky electrode 50 and the drift layer 20). This causes the pn junction portion's potential to be close to the potential of the silicon carbide pn diode of FIG. 4b, thereby reducing the potential difference between the p-type region of the pn junction and the n-type region thereof. Therefore, the pn diode can be turned on by applying a lower bias voltage.

In addition, if the second well region 40 has a depth (a length in a vertical direction) of 3 μm to 6 μm, a greater effect can be obtained. Depending on the thickness of the drift layer 20, a depth of 0.5 μm or more is effective.

As described above, in the silicon carbide JBS diode, a current flowing in the Schottky diode portion is dominant among the on-current; therefore, if the first well region 30 is formed deeper with its width kept constant, an effect is diminished that the Schottky diode portion's on-current flows spreading from the Schottky interface (an interface between the Schottky electrode 50 and the drift layer 20) toward the ohmic electrode 60, to be a current corresponding to the Schottky interface area or wider. This reduces the on-current.

Figure 7:
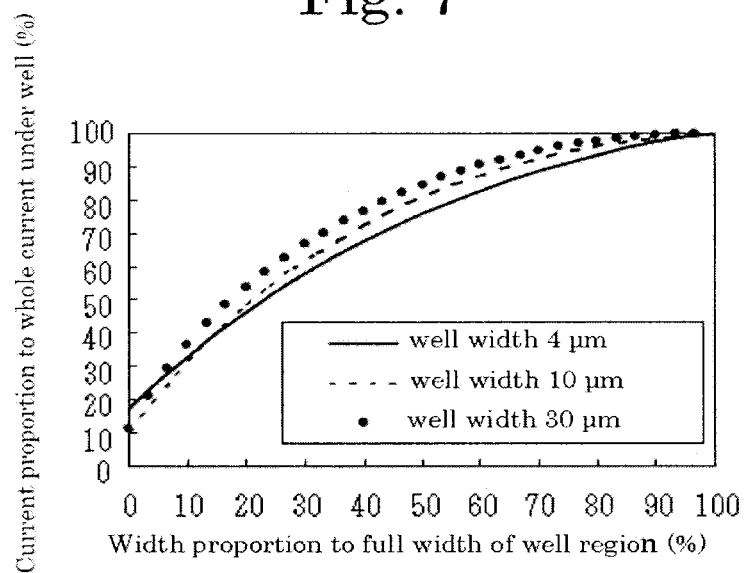
FIG. 7 is a current ratio graph for explaining the operation of the semiconductor device in Embodiment 1 of the present invention.

FIG. 7 is a graph which relates to a typical silicon carbide JBS diode whose cross-sectional view is shown in FIG. 4a, and which indicates a proportion of a current flowing through regions within a predetermined width from the right and left ends of the first well region 31 to a current flowing directly under the first well region 31. In the graph, the horizontal axis is a proportion of a width to the full width of the first well region 31 (equivalent to an area proportion in a top view). FIG. 7 shows numerical calculation results of cases in which the first well region 31 has a width of 4 μm, 10 μm, or 30 μm.

FIG. 7 reveals that 50% or more of the current flowing under the entire first well region 31 flows in regions ranging from the edges of the first well region 31 to 25% width of the full width of the first well region 31, i.e. the regions of 25% of the entire top face area of the first well region 31 from the edges of the first well region 31. That is, only 50% or less of the current flowing under the entire first well region 31 flows in an area occupying central 75% of the first well region 31, so that an on-current density in this area is low.

Figure 8:
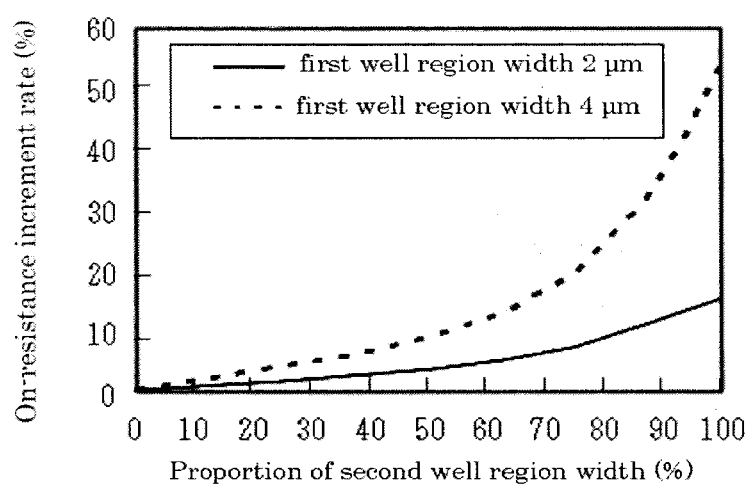
FIG. 8 is an on-current increase ratio graph for explaining the operation of the semiconductor device in Embodiment 1 of the present invention.

FIG. 8 is a graph which relates to a silicon carbide JBS diode whose cross-sectional view is shown in FIG. 1, and which indicates how an on-resistance of the element, i.e. the resistance of the element in the on-state, is varied when a proportion of the width of the second well region 40 with respect to the width of the first well region 30 is varied. In FIG. 8, the horizontal axis is a proportion of the width of the second well region 40 with respect to the width of the first well region 30, and the vertical axis is an increment rate of the element's on-resistance with respect to that in a condition in which the width of the second well region 40 is zero, i.e., the second well region 40 is not formed; a broken line shows a case of the first well region 30 having a width of 2 μm, and a solid line shows a case of the first well region 30 having a width of 4 μm.

As shown in FIG. 8, it is seen that as the proportion of the width of the second well region 40 with respect to the width of the first well region 30 becomes large, the on-resistance increases; furthermore, when the proportion exceeds about 75%, the slope of the on-resistance increment rate with respect to the proportion becomes large.

In the JBS diode, the on-current flows from directly under the Schottky electrode 50, curving its way toward under the first well region 30 and the second well region 40; more specifically, this result shows that at a portion directly under the first well region 30, the closer to a region (a Schottky diode portion) having no first well region 30, i.e. the closer to the edge portions of the first well region 30 in the cross-section's horizontal direction the portion is, the higher the on-current's current density of the portion becomes, and also indicates that such current flows in regions of about 25% of the first well region 30 ranging from the end portions thereof.

From the results of FIG. 7 and FIG. 8, it is seen that a drop of the on-current can be decreased in the silicon carbide JBS diode having the structure of FIG. 1, by making the width of the second well region 40 narrower than that of the first well region 30. Furthermore, the on-current can be increased more than that of a case where the insulation film is provided between the Schottky diode portion and the pn diode portion as in Patent Document 2.

It is more preferable that in the silicon carbide JBS diode having the structure of FIG. 1, a portion that ranges from the edge portion of the first well region 30 in the cross-section's horizontal direction to 25% of the region's width is of n-type so as to serve as a current path spreading from the Schottky diode. That is, a cross-section's horizontal width of the second well region 40 is made to be three fourths or less of the width of the first well region 30, thereby preventing the on-current from greatly reducing.

Next, numerical calculation results will be shown about an on-current characteristic and an off-current characteristic of the silicon carbide JBS diode of this embodiment. The on-current characteristic and the off-current characteristic have been calculated under a condition that the drift layer 20 has a differential resistivity of 10 mΩcm$^2$ or below and a withstand voltage of 4 kV or higher, the first well region 30 has a width of 4 µm, a depth of 0.3 µm, and an impurity density of $2\times10^{18}$ cm$^{-3}$, and the second well region 40 has a width of 3 µm, a depth of 6 µm and an impurity density of $2\times10^{16}$ cm$^{-3}$.

Figure 9:
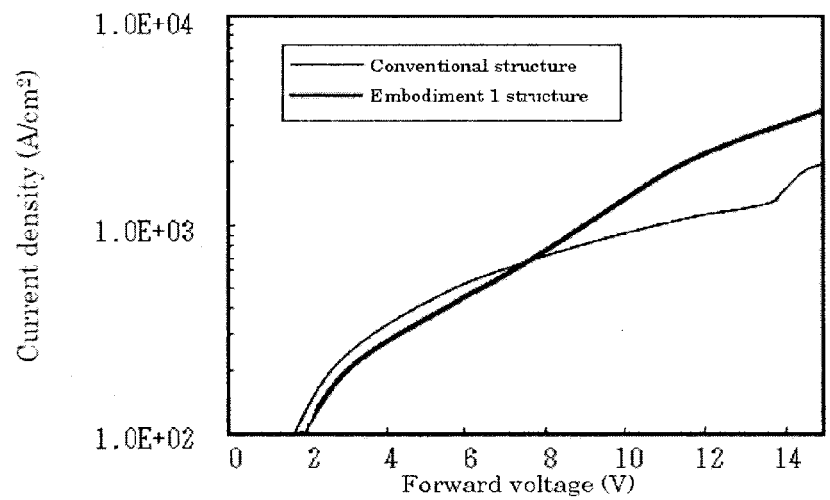
FIG. 9 is an on-current characteristic graph of the semiconductor device in Embodiment 1 of the present invention.

FIG. 9 is for comparing on-current characteristics between a silicon carbide JBS diode having a structure of FIG. 4a (a conventional structure) and the silicon carbide JBS diode of this embodiment. In FIG. 9, at a bias voltage of about 7 V or higher, the silicon carbide JBS diode of this embodiment has a current density larger than that having the conventional structure.

Figure 10:
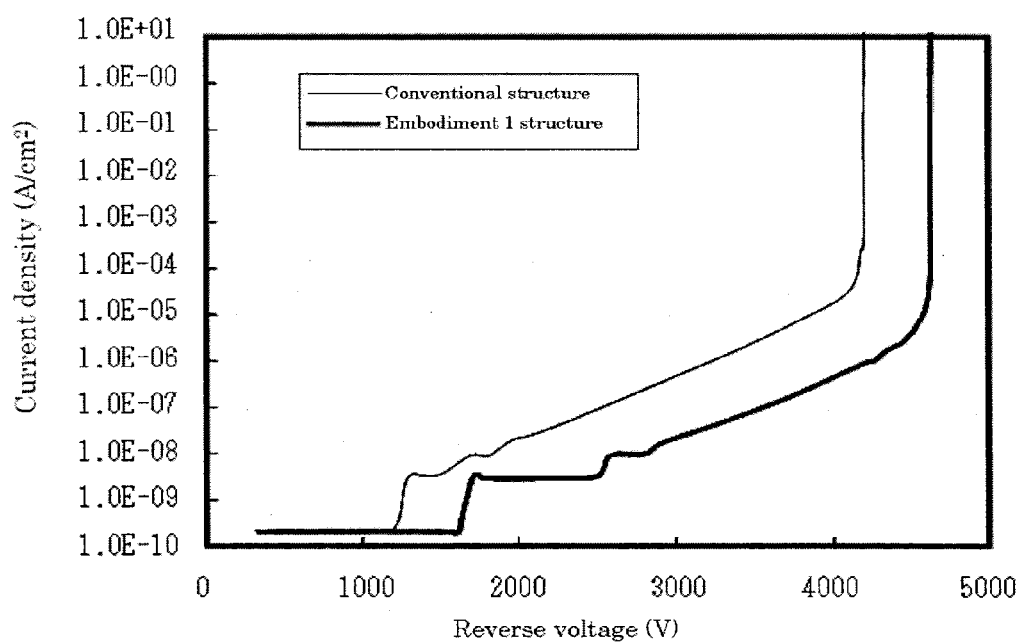
FIG. 10 is an off-current characteristic graph of the semiconductor device in Embodiment 1 of the present invention.

FIG. 10 is for comparing off-current characteristics between the silicon carbide JBS diode having a structure of FIG. 4a and the silicon carbide JBS diode of this embodiment. FIG. 10 shows that in comparison to the diode having the conventional structure, the silicon carbide JBS diode of this embodiment has a smaller reverse current density and a larger breakdown voltage, thereby having an improved off-state withstand voltage.

In the silicon carbide JBS diode of this embodiment, the second well region 40 is formed so as to be entirely depleted in the off-state; therefore, the off-state withstand voltage is improved without deterioration as in a case where a first well region 30 with a relatively high impurity density is simply formed deeper.

As described above, in the silicon carbide JBS diode, i.e. the semiconductor device of this invention, the pn junction of the pn diode is formed at a portion away from the Schottky electrode and the well region is formed to have a narrow width at a portion away from the Schottky electrode; therefore, a lower bias voltage can cause a current to flow in the pn diode, and the current flowing in the Schottky diode can be increased. Therefore, even in a case where a surge current is generated, the surge current can easily flow in the pn diode, preventing an overcurrent from flowing in the Schottky diode. This enables to obtain a semiconductor device which has a high switching speed and an improved protection function in a case where a large current such as the surge is applied.

In the silicon carbide JBS diode, i.e. a semiconductor device of this embodiment, the second well region 40 is entirely depleted in the off-state; therefore, the off-state withstand voltage is not lowered as much as when simply forming a deeper first well region 30 with a relatively high impurity density.

Furthermore, in the silicon carbide JBS diode, i.e. a semiconductor device of this embodiment, the first well region is not completely depleted even in the off-state; this causes the depletion layer to easily spread into the drift layer 20 between the first well regions 30, ensuring a withstand voltage.

In this embodiment, explanation has been made about an example of a semiconductor device using a silicon carbide semiconductor; however, the same effect can be obtained in a semiconductor device using a wide band gap semiconductor such as GaN and diamond. In addition, it is not necessary that the silicon carbide semiconductor is of 4H silicon carbide semiconductor; the same effect can be obtained by 3C silicon carbide semiconductor or the like.

Figure 11:
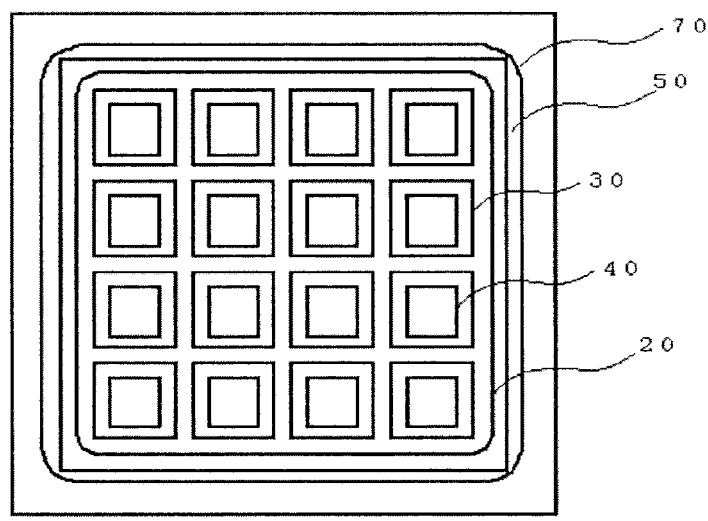
FIG. 11 is a plan view that represents an aspect of the semiconductor device in Embodiment 1 of the present invention.

With respect to the plane structure of the silicon carbide JBS diode of this embodiment, explanation has been made using an example of FIG. 2 in which the rectangular first well regions 30 and the rectangular second well regions 40 are arranged; however, the plane structure is not limited to that, another plane structure may be taken in which, as shown in a top view of FIG. 11, square first well regions 30 and square second well regions 40 are arranged lengthwise and widthwise. In this case, the dimension of width is defined both for the lengthwise and widthwise directions in the plan view.

As described above, the plane structure is not limited to that shown in FIG. 2, another plane structure may be taken whose top view shows polygons or circles.

Nitrogen and aluminum have been taken as examples of the n-type impurity and the p-type impurity; however, other impurities may be used, for example, phosphorus for the n-type impurity and boron for the p-type impurity.

Explanation has been made using an example in which Ti is used for the Schottky electrode 50, and Ni is used for the ohmic electrode 60; however, the materials of the Schottky electrode 50 and the ohmic electrode 60 are not limited to those. For the Schottky electrode 50, a material may be appropriately selected among materials such as Mo or Ni that forms Schottky connection with the n-type drift layer 20. For the ohmic electrode 60, any other metal may be used that ohmically connects to the n-type semiconductor substrate 10.

In the steps of manufacturing the semiconductor device of this embodiment, it has been explained that the steps of FIG. 3c and FIG. 3d are repeated. However, these steps may be performed depending on the depth (the thickness) of the second well region 40; for example, the steps of FIG. 3c and FIG. 3d may not be performed.

In the description above, an example has been explained in which a surface layer portion of the drift layer 20 (Schottky interface) that is between the first well regions 30 adjacent to each other and in contact with the Schottky electrode 50 is entirely depleted by a depletion layer expanding from the first well region 30 in the off-state; however, for a semiconductor device which does not require a high withstand voltage, it is not necessary to entirely deplete the Schottky interface in the off-state, and it may suffice that the Schottky interface is not entirely depleted in the off-state.

In the description above, an example has been explained in which the second well region 40 is entirely depleted in the off-state; however, for a semiconductor device which does not require a high withstand voltage, it is not necessary to entirely deplete the second well region 40 in the off-state, and it may suffice that the second well region 40 is not entirely depleted in the off-state.

Embodiment 2

Figure 12:
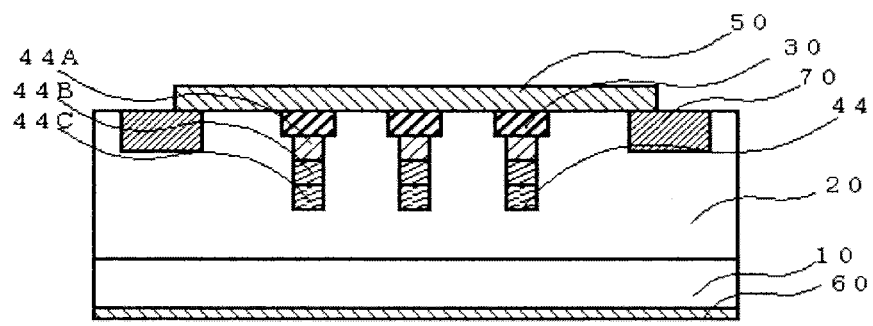
FIG. 12 is a schematic cross-sectional view that schematically represents a silicon carbide semiconductor device in Embodiment 2 of the present invention.

FIG. 12 is a schematic cross-sectional view of a silicon carbide JBS diode, i.e. a silicon carbide semiconductor device of this embodiment. The impurity density of the second well region 40 of Embodiment 1 is uniform; however, in FIG. 12, a second well region 44 vertically includes regions having impurity densities of three gradations. The second well region 44 is formed so that its density becomes lower as its portion is positioned deeper. More specifically, in the second well region 44, a portion nearest to the semiconductor substrate 10 has a p-type impurity density lower than a region neighboring to the first well region 30. Other portions are the same as those in Embodiment 1; therefore, their detailed explanation will be omitted. In the operation explanation below, a device will be explained in which the first well region 30 has an impurity density of $2\times10^{18}$ cm$^{-3}$; impurity densities of the second well region 44 are, in order from a shallow region, $2\times10^{18}$ cm$^{-3}$, $2\times10^{17}$ cm$^{-3}$, and $2\times10^{16}$ cm$^{-3}$; and each of the three regions (in order from the shallow region, 44A, 44B, and 44C) has a thickness of 2 μm. Here, the average impurity density of the second well region 44 is lower than the impurity density of the first well region 30.

The silicon carbide JBS diode of FIG. 12 can be manufactured by using a method explained in FIG. 3 of Embodiment 1 with respective ion implantation densities being varied according to the gradations.

Figure 13:
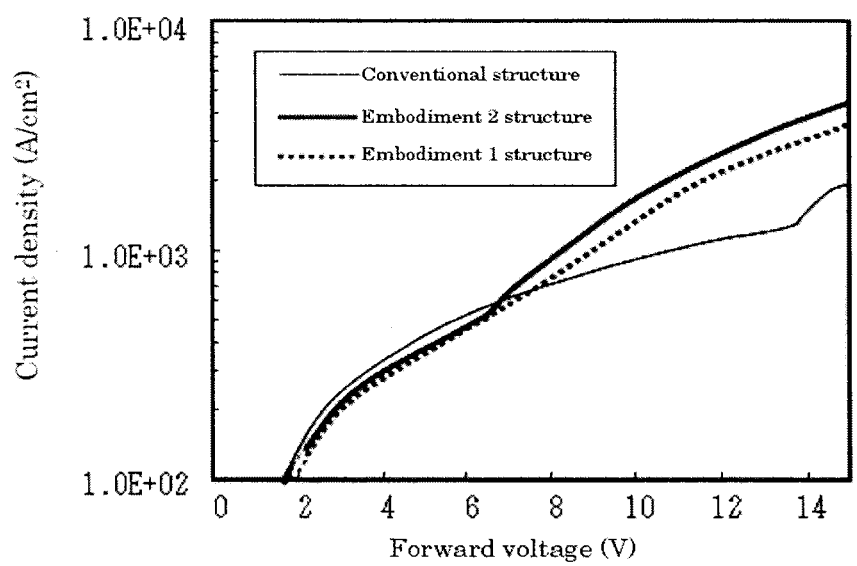
FIG. 13 is an on-current characteristic graph of the semiconductor device in Embodiment 2 of the present invention.

FIG. 13 is for comparing on-currents of a silicon carbide JBS diode having a structure of FIG. 4*a*, a silicon carbide JBS diode of Embodiment 1 of FIG. 1, and a silicon carbide JBS diode of this embodiment. FIG. 13 shows that at about a bias voltage of 7 V or more, the silicon carbide JBS diode of this embodiment has a current density larger than the conventionally structured one and also has an on-current larger than the silicon carbide JBS diode of Embodiment 1.

Figure 14:
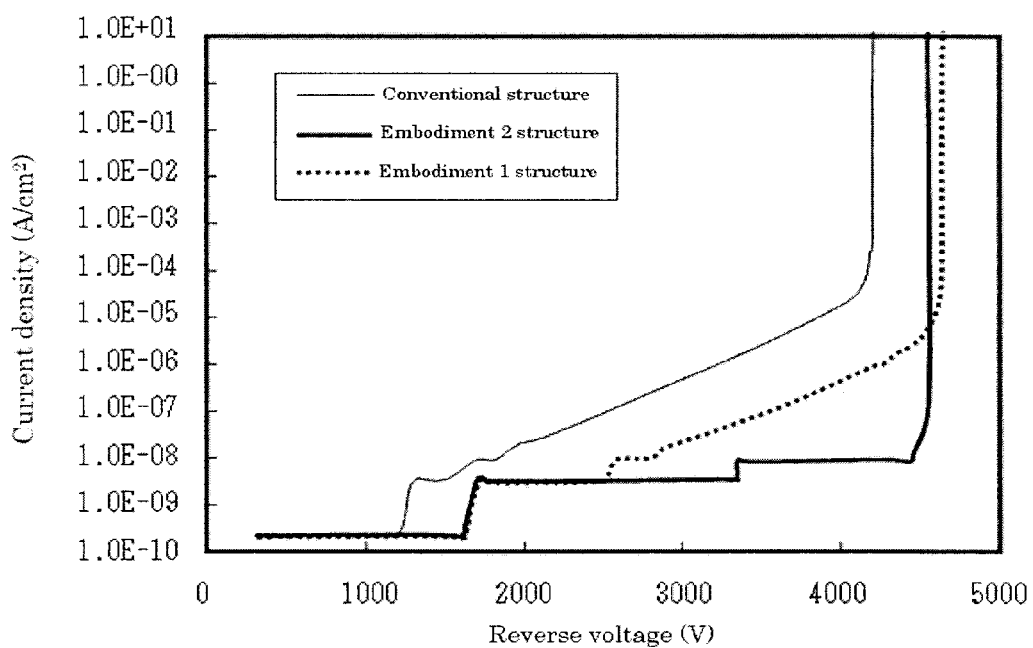
FIG. 14 is an off-current characteristic graph of the semiconductor device in Embodiment 2 of the present invention.

FIG. 14 is for comparing off-currents of a silicon carbide JBS diode having a structure of FIG. 4*a*, a silicon carbide JBS diode of Embodiment 1 of FIG. 1, and a silicon carbide JBS diode of this embodiment. FIG. 14 shows that when compared with the conventionally structured diode, the silicon carbide JBS diode of this embodiment has a smaller reverse current density and a larger breakdown voltage to be improved in the off-state withstand voltage. Furthermore, the silicon carbide JBS diode of this embodiment also has an off-state reverse current density smaller than the silicon carbide JBS diode of Embodiment 1.

As described above, according to a silicon carbide JBS diode, i.e. the semiconductor device of this embodiment, the on-current can be further raised and the off-characteristic can be further improved, compared to the semiconductor device of Embodiment 1.

Embodiment 3

Figure 15:
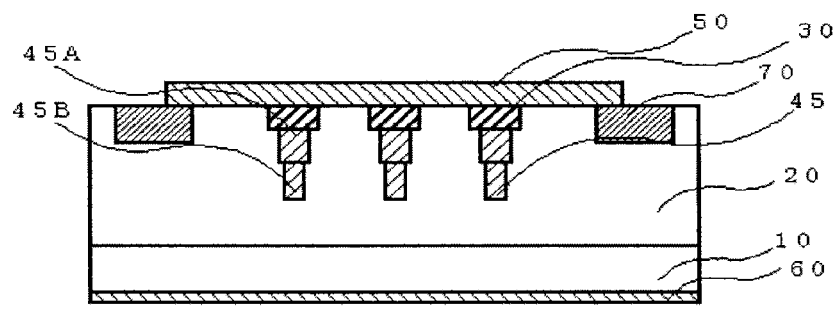
FIG. 15 is a schematic cross-sectional view that schematically represents a silicon carbide semiconductor device in Embodiment 3 of the present invention.

FIG. 15 is a schematic cross-sectional view of a silicon carbide semiconductor device, i.e. a semiconductor device of this embodiment. A second well region 45 has two widths in a vertical direction while the width of the second well region 40 of Embodiment 1 is constant in FIG. 1. The second well region 45 is formed so that its width becomes narrower as its portion is located deeper. More specifically, in the second well region 45, a portion nearest to the semiconductor substrate 10 is narrower than a region neighboring the first well region 30. Other portions are the same as those in Embodiment 1; therefore, their detailed explanation will be omitted. In the operation explanation below, a device will be explained in which the first well region 30 has an impurity density of $2 \times 10^{18}$ cm$^{-3}$; the widths of the second well region 45 are, in order from a shallow region, 3 μm and 1.5 μm; and each of the two regions (in order from the shallow region, 45A and 45B) has a thickness of 3 μm.

The silicon carbide JBS diode of FIG. 15 can be manufactured by varying an opening width of the implantation mask when performing ion implantation in the method explained in FIG. 3 of Embodiment 1.

Figure 16:
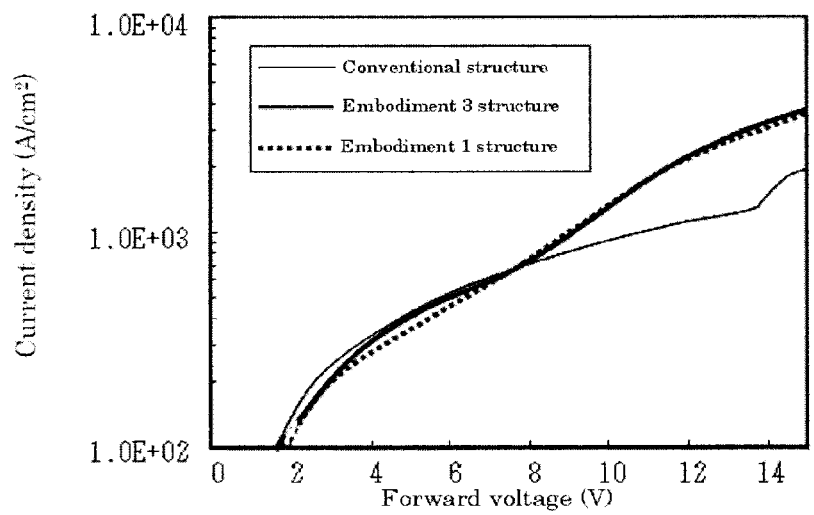
FIG. 16 is an on-current characteristic graph of the semiconductor device in Embodiment 3 of the present invention.

FIG. 16 is for comparing on-currents of a silicon carbide JBS diode having a structure of FIG. 4*a*, a silicon carbide JBS diode of Embodiment 1 of FIG. 1, and a silicon carbide JBS diode of this embodiment. FIG. 16 shows that at about a bias voltage of 7 V or more, the silicon carbide JBS diode of this embodiment has a current density larger than the conventionally structured one and also has an on-current characteristic equivalent to or better than the silicon carbide JBS diode of Embodiment 1.

Figure 17:
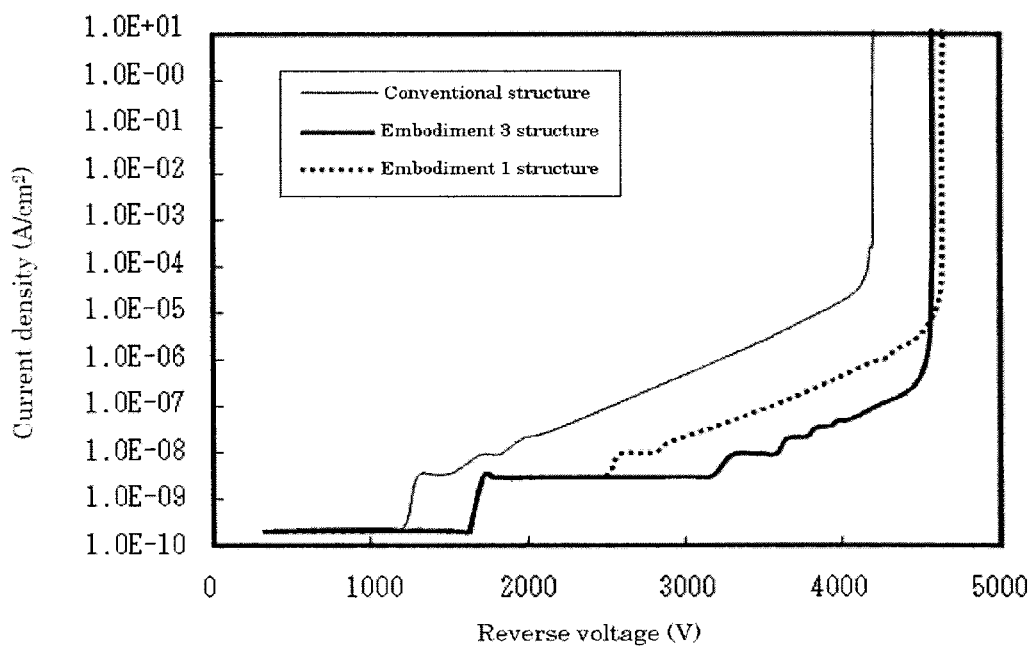
FIG. 17 is an off-current characteristic graph of the semiconductor device in Embodiment 3 of the present invention.

FIG. 17 is for comparing off-currents of a silicon carbide JBS diode having a structure of FIG. 4*a*, a silicon carbide JBS diode of Embodiment 1 of FIG. 1, and a silicon carbide JBS diode of this embodiment. FIG. 17 shows that when compared with the conventionally structured diode, the silicon carbide JBS diode of this embodiment has a smaller reverse current density and a larger breakdown voltage to have an improved off-state withstand voltage. Furthermore, the silicon carbide JBS diode of this embodiment has a smaller off-state reverse current density even compared with the silicon carbide JBS diode of Embodiment 1.

As described above, according to the silicon carbide JBS diode, i.e. the semiconductor device of this invention, the well regions are formed so as to have narrower widths at portions away from the Schottky electrode. This can improve the on-current characteristic of the silicon carbide JBS diode.

Embodiment 4

Figure 18:
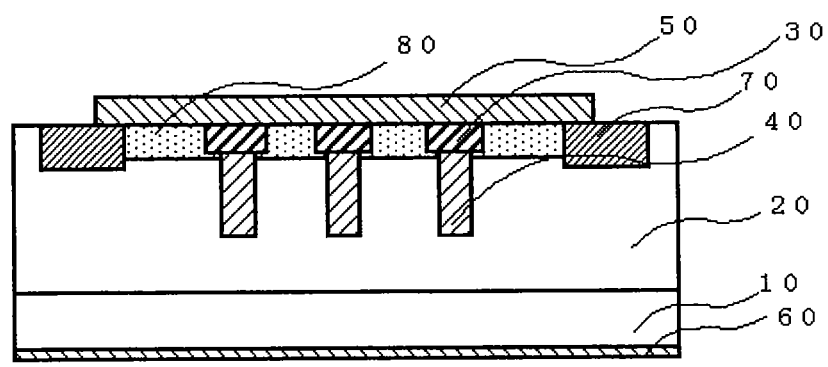
FIG. 18 is a schematic cross-sectional view that schematically represents a silicon carbide semiconductor device in Embodiment 4 of the present invention.

FIG. 18 is a schematic cross-sectional view of a silicon carbide semiconductor device, i.e. a semiconductor device of this embodiment. The impurity density of the n-type drift layer 20 of Embodiment 1 is uniform; however, in FIG. 18, in a surface layer portion of the drift layer 20 that is in contact with the Schottky electrode 50, a high density drift region 80 is formed which is of n-type and has an n-type impurity density higher than the drift layer 20. The high density drift region 80 is formed shallower than the second well region 40. Other configurations are the same as those in Embodiment 1; therefore, their detailed explanation will be omitted.

On the basis of the method explained in FIG. 3 of Embodiment 1, the silicon carbide JBS diode shown in FIG. 18 can be manufactured by forming, immediately after forming the final drift layer 20 (epitaxial layer) or after forming a first well region 30, the n-type high density drift region 80 having an n-type impurity density higher than the drift layer 20 in a portion of the surface layer portion of the drift layer 20 to be later connected to the Schottky electrode 50, using an ion implantation method or the like.

Figure 19:
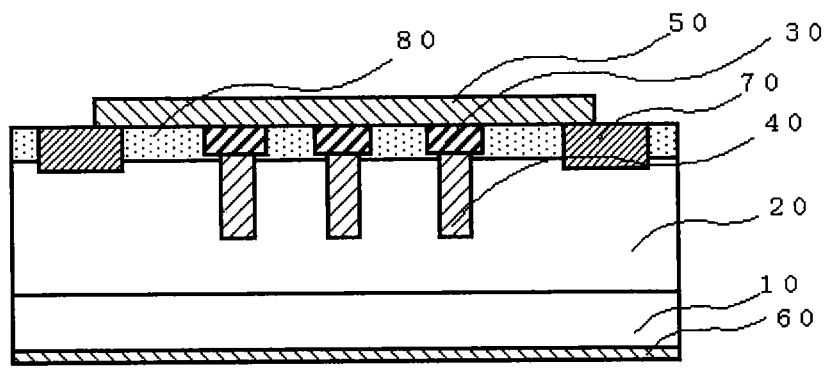
FIG. 19 is a schematic cross-sectional view that schematically represents a silicon carbide semiconductor device in Embodiment 4 of the present invention.

In addition, the high density drift region 80 may be formed, as shown in the schematic cross-sectional view of FIG. 19, in the whole top region of the drift layer 20. In this case, the high density drift region 80 may be formed on the drift layer 20 not by the ion implantation method, but by an epitaxial growth method.

Figure 20:
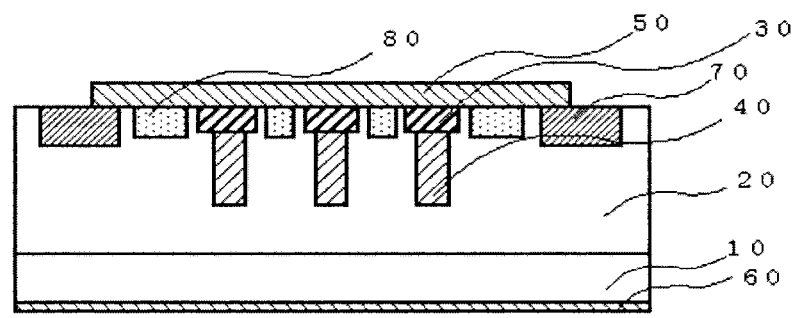
FIG. 20 is a schematic cross-sectional view that schematically represents a silicon carbide semiconductor device in Embodiment 4 of the present invention.

As shown in a schematic cross-sectional view of FIG. 20, high density drift regions 80 may be formed partially in a region where the first well regions 30 are not formed.

In the silicon carbide JBS diode of this embodiment, a region directly under the Schottky electrode 50, serving as a current path of the on-current, is a high density drift region 80 having a high n-type impurity density; therefore, the on-resistance of the silicon carbide JBS diode can be reduced. In the surface layer portion of the drift layer 20, the high density drift region 80 is formed shallower than the second well region 40; therefore, the bottom face of the second well region 40 is prevented from being in a high electric field, which also prevents the withstand voltage from being greatly deteriorated.

In addition, explanation has been made in Embodiments 1 to 4, assuming that the first conductive type is n-type, and the second conductive type is p-type; however, not limiting to that, the same effect can be obtained assuming that the first conductive type is p-type, and the second conductive type is n-type.

In addition, in Embodiments 1 to 4, the description of depleting means that a relation between voltage and impurity density is designed for depletion.

NUMERAL EXPLANATION 10 semiconductor substrate
20 drift layer
30 first well region
40 second well region
50 Schottky electrode
60 ohmic electrode
70 termination structure
80 high density drift region

The invention claimed is:

1. A semiconductor device comprising:
a wide band gap semiconductor substrate that is of a first conductive type;
a drift layer that is of the first conductive type and configured with a wide band gap semiconductor and that is formed on a first main surface of the wide band gap semiconductor substrate;
a plurality of first well regions that are of a second conductive type and that are formed in a surface layer portion of the drift layer adjacent to each other at a predetermined interval;
a second well region that is formed adjacent to each of the first well regions and toward the semiconductor substrate, has a second conductive type impurity density lower than the first well regions, and has a constant width that is narrower than a width of the first well regions to form T-shaped well configurations;
a Schottky electrode that is formed on surfaces of the drift layer and the first well regions to form a Schottky connection with the drift layer; and
an ohmic electrode that is formed on a second main surface of the semiconductor substrate which is opposite to the first main surface,
wherein at least some regions in the first well regions are not depleted when the semiconductor device is in an off-state.

2. The semiconductor device according to claim 1, wherein when the semiconductor device is in an off-state, the second well region is entirely depleted.

3. The semiconductor device according to claim 1, wherein when the semiconductor device is in an off-state, a surface layer portion of the drift layer that is between the first well regions and that is in contact with the Schottky electrode is entirely depleted by a depletion layer expanding from the first well regions adjacent to each other.

4. The semiconductor device according to claim 1, wherein the constant width of the second well region is three fourths or less of the width of each of the first well regions.

5. The semiconductor device according to claim 1, wherein in the second well region, a portion nearest to the semiconductor substrate has a second conductive type impurity density lower than a region neighboring each of the first well regions.

6. The semiconductor device according to claim 1, wherein the drift layer is provided between the second well region and the semiconductor substrate.

7. The semiconductor device according to claim 1, wherein in the second well region, a portion nearest to the semiconductor substrate has a width narrower than a region neighboring each of the first well regions.

8. The semiconductor device according to claim 1, wherein at a position at which a surface layer portion of the drift layer is connected to the Schottky electrode, a high density drift region is provided so as to have a first conductive type impurity density higher than the drift layer.

9. The semiconductor device according to claim 1, wherein the wide band gap semiconductor substrate is a silicon carbide semiconductor substrate, and the wide band gap semiconductor is a silicon carbide semiconductor.

* * * * *